(12) United States Patent
Kim et al.

(10) Patent No.: US 6,458,709 B2
(45) Date of Patent: Oct. 1, 2002

(54) METHOD FOR FABRICATING A REPAIR FUSE BOX FOR A SEMICONDUCTOR DEVICE

(75) Inventors: Eul Rak Kim; Joong Shik Shin, both of Seoul (KR)

(73) Assignee: Hyundai Electronics Industries Co., Ltd. (KR)

( * ) Notice: Subject to any disclaimer, the term of this patent is extended or adjusted under 35 U.S.C. 154(b) by 19 days.

(21) Appl. No.: 09/751,847

(22) Filed: Jan. 2, 2001

(30) Foreign Application Priority Data

Dec. 31, 1999 (KR) .............................................. 99-68041

(51) Int. Cl.[7] .............................................. H01L 21/00
(52) U.S. Cl. ........................... 438/707; 216/21; 216/65; 216/79; 438/719; 438/723; 438/737; 438/740
(58) Field of Search ..................... 438/4, 707, 719, 438/723, 743, 753, 737, 740; 216/21, 65, 79, 99

(56) References Cited

U.S. PATENT DOCUMENTS

| | | | |
|---|---|---|---|
| 5,891,762 A | | 4/1999 | Sakai et al. |
| 5,976,978 A | * | 11/1999 | Salisbury ................ 438/707 X |
| 6,017,824 A | * | 1/2000 | Lee et al. ................ 438/735 X |

FOREIGN PATENT DOCUMENTS

JP    9-51038    2/1997

* cited by examiner

*Primary Examiner*—William A. Powell
(74) *Attorney, Agent, or Firm*—Pillsbury Winthrop LLP

(57) ABSTRACT

A method for fabricating a repair fuse box of a semiconductor device is disclosed. An etching stop polysilicon layer formed at a belt shape in edge portions of a repair fuse box is broken during a repair etching process without substantial departure from prior art methods for fabricating a repair fuse box of a semiconductor device. Thus, it is possible to improve repair yield of the semiconductor device.

2 Claims, 3 Drawing Sheets

METHOD FOR FABRICATING A REPAIR FUSE BOX FOR A SEMICONDUCTOR DEVICE

BACKGROUND OF THE INVENTION

1. Field of the Invention

The present invention relates to a method for fabricating a repair fuse box for a semiconductor device and, more particularly, to a method for fabricating a repair fuse box for a semiconductor device in which the layout of an etching stop polysilicon layer within the semiconductor repair fuse box may be varied without requiring an additional process step and thereby improve the repair yield of the semiconductor device.

2. Background of the Related Art

When a defective portion of a semiconductor device has been in fabricating a semiconductor device, the defective portion is generally repaired. Particularly during the fabrication of a semiconductor DRAM device, the defective portions are replaced using a redundancy cell to repair the device and improve the yield.

A prior art repair method will be described with reference to FIGS. 1 and 2 which show prior art repair fuse boxes.

Referring to FIG. 1, a related art repair fuse box 10 is defined in a rectangular shape. Polysilicon fuses 12 (Poly2) are arranged within the repair fuse box 10, and an etching stop polysilicon layer 14 (Poly4) is formed in a rectangular belt shape surrounding the repair fuse box 10.

Referring to FIG. 2, a first insulating film 20 and the fuses 12 are formed on a semiconductor substrate (not shown). A second insulating film 22, the etching stop polysilicon layer 14 and a third insulating film 24 are formed on upper portions of the first insulating film 20 and the fuses 12. The third insulating film 24 is formed outside the repair fuse box 10, and the etching stop polysilicon layer 14 is formed on insulating film 22 around the edge portions of the repair fuse box 10.

When the prior art Poly2 or Poly1 levels are used to form the fuses 12, the fuses 12 are susceptible to a thickness of an oxide film that remains over the fuses 12. Thus, the fuses 12 may be broken. Accordingly, the etching stop polysilicon layer 14 is formed on a portion which will be used as the repair fuse box 10, so that the thickness of the oxide film remaining over the fuses 12 can be controlled uniformly during the subsequent process that will open the repair fuse box.

In order to repair a semiconductor device using a redundancy cell, certain the fuses 12 within repair fuse box 10 are then cut by lasers to disconnect a predetermined portion of the device circuitry.

As shown in FIGS. 3 and 4, however, a polysilicon residue 16 is fused and sticks to a sidewall of the fuse box 10 when cutting the fuses 12. In other words, if the fuses 12 are of W salicide layer, the polysilicon residue 16 of $WSi_x$ can remain within the fuse box. The remaining portion of the cut fuses 12 can become connected to the etching stop polysilicon layer 14 by this polysilicon residue 16, thereby causing poor repair performance.

SUMMARY OF THE INVENTION

The claimed inventions are directed to fabricating a repair fuse box for a semiconductor device that substantially overcomes one or more of the limitations and disadvantages of the prior art.

The layout of an etching stop polysilicon layer within a semiconductor repair fuse box is varied, without requiring additional process step, to improve the repair yield of the semiconductor device.

Additional advantages and features of the invention will be set forth in part in the following description and may become apparent to those having ordinary skill in the art upon review of the description or may be learned from practicing the invention. The objects and advantages of the invention may be realized and attained as particularly pointed out in the appended claims.

We form a first insulating film on a semiconductor substrate. Fuses are formed on the first insulating film. A second insulating film is formed on the fuses and the first insulating film. An etching stop polysilicon pattern layer is formed on a portion of the second insulating film where the repair fuse box will be formed. The etching stop polysilicon pattern is larger than the intended fuse box and is positioned so as to overlap edge portions of the repair fuse box. A third insulating film is formed on the entire surface of the above structure. A photoresist pattern is formed on the third insulating film to expose a portion, which will be used as a repair fuse box, so that at least two portions where the edge portions of the repair fuse box overlap the etching stop polysilicon layer are exposed. The third insulating film is removed using the photoresist pattern as a mask to expose the etching stop polysilicon layer. The exposed etching stop polysilicon layer is etched to form an etching stop polysilicon layer pattern having two or more broken portions in a belt shape at the edge portions of the repair fuse box. A portion of the second insulating film exposed by the photoresist pattern is etched to reduce the thickness of the second insulating film above the fuses.

In the preferred embodiment of the present invention, the fuses are formed of Poly1 or Poly2 levels, and the etching stop polysilicon layer is formed of polysilicon from the Poly4 level.

It is to be understood that both the foregoing general description, the following detailed description and the figures intended to provide further explanation of the invention as claimed and not as limiting the invention to the particular embodiments illustrated and described.

BRIEF DESCRIPTION OF THE DRAWINGS

The invention will be described in detail with reference to the following figures in which corresponding reference numerals are intended to refer to corresponding elements wherein.

DETAILED DESCRIPTION OF PREFERRED EMBODIMENTS

Reference will now be made in detail to the preferred embodiments of the present invention, examples of which are illustrated in the accompanying figures.

Figure 5:
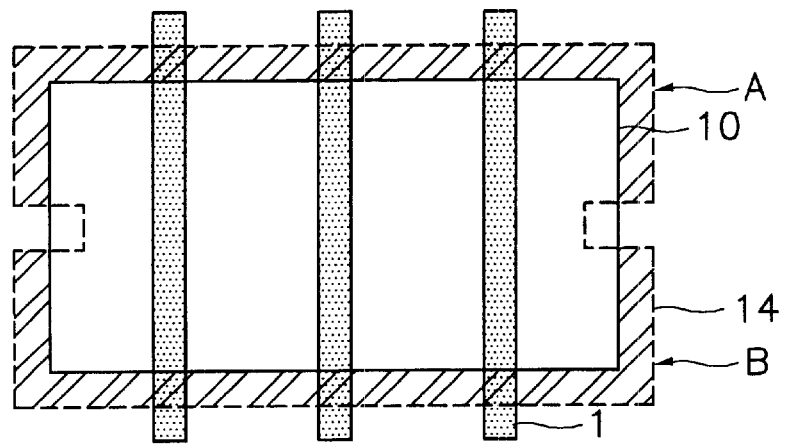
FIG. 5 is a layout of a repair fuse box according to one embodiment of the present invention.

FIG. 5 illustrates a layout of a repair fuse box according to one embodiment of the present invention.

Polysilicon fuses 12 are preferably formed from a Poly2 layer in conjunction with the formation of a bitline or charge storing electrode. The fuses 12 are formed in a repair fuse box 10 that has a generally rectangular shape. At the edge portions of the repair fuse box 10, an etching stop polysilicon layer 14 formed in conjunction with the formation of the bitline or charge storing electrode. The etching stop polysilicon layer 14 is formed in a belt shape having at least two broken portions.

Figure 1:
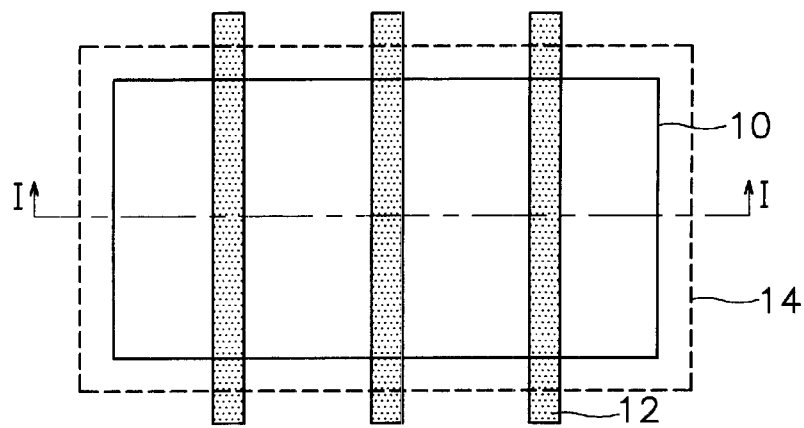
FIG. 1 is a layout of a related art repair fuse box.
Figure 2:
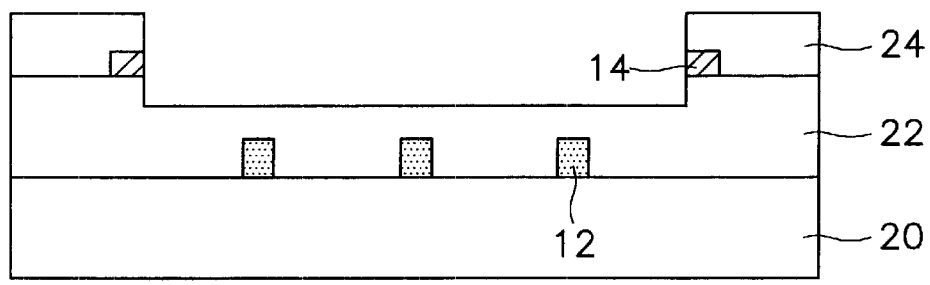
FIG. 2 is a sectional view taken along line I'–I" of FIG. 1.
Figure 3:
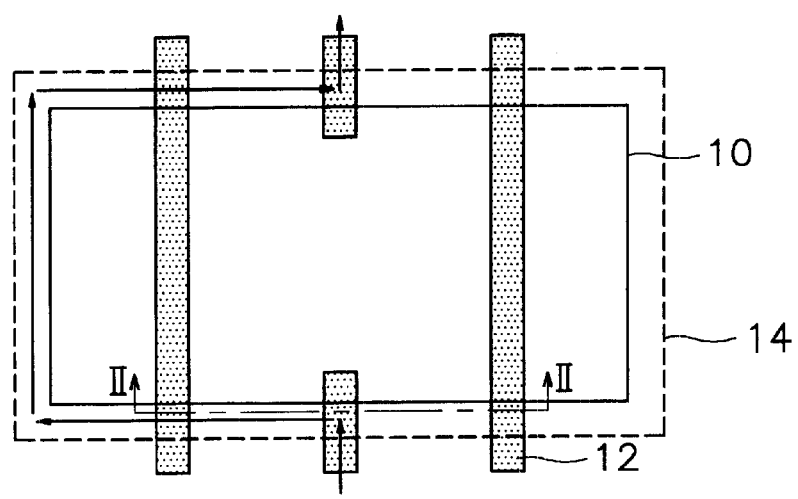
FIG. 3 is a layout of a repair fuse box in case that a repair is failed.
Figure 4:
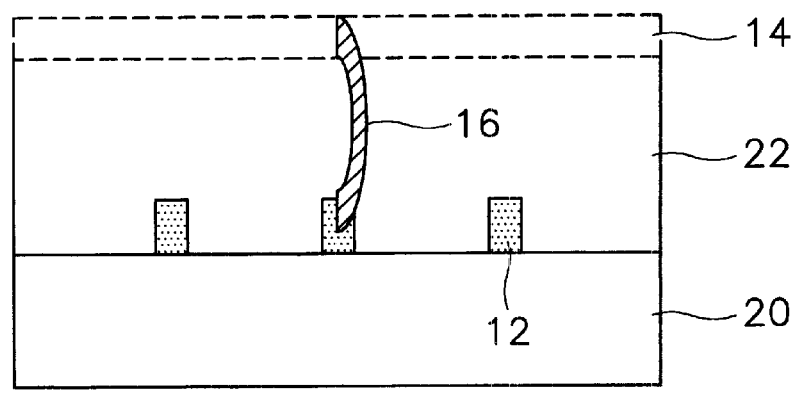
FIG. 4 is a sectional view taken along line II'–II" of FIG. 3.

A method for fabricating the repair fuse box 10 according to the present invention will be described with reference to FIG. 2.

First, a first insulating film 20 is formed on a semiconductor substrate (not shown), and fuses 12 are formed on the first insulating film 20 during the process of forming Poly2 or Poly1 patterns. Then, a second insulating film 22, the etching stop polysilicon layer 14 and a third insulating film 24 are sequentially formed on the upper portion of an entire surface. The etching stop polysilicon layer 14 is formed to be larger than the intended repair fuse box 10 which will be formed later, so that the edge portions of the repair fuse box 10 are overlapped by the etching stop polysilicon layer 14.

A photoresist pattern (not shown) is then formed to expose a portion which will be used as the repair fuse box. The third insulating film 24 is then removed using the photoresist pattern as a mask. A portion of the etching stop polysilicon layer 4 is then removed, leaving portions on edges of the repair fuse box 10 in a belt shape. Thus, the repair fuse box 10 has a "C" or "[" shaped sink portion in two portions of the edges. Then, the second insulating film 22 is particularly etched to establish a constant thickness over the fuses 12. The photoresist pattern is then removed, leaving a predetermined thickness of the film 22 on the fuses 12.

As shown in FIG. 5, portions A and B of the etching stop polysilicon layer 14 are formed from the same polysilicon layers. However, although the portions A and B are in contact with each other before the repair fuse box etching process, the portions A and B are defined and separated from each other during the repair fuse box etching process.

As described above, if the etching stop polysilicon layer 14 is broken during the repair fuse box etching process that forms the repair fuse box 10, shorts between the fuse 12 and a portion of the etching step polysilicon wafer resulting from polysilicon residue remaining from the laser repair process do not defeat the repair process.

Figure 6:
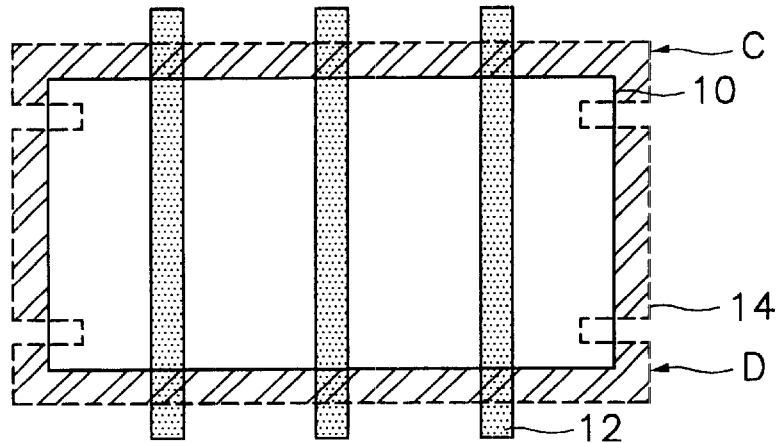
FIG. 6 is a layout of a repair fuse box according to another embodiment of the present invention.

FIG. 6 is a layout of a repair fuse box according to other embodiment of the present invention. Referring to FIG. 6, the etching stop polysilicon layer 14 having a belt shape is broken at both sides. In other words, portions C and D of the etching stop polysilicon layer 14 are twice broken by the repair fuse box etching process.

As discusses above, the method for fabricating a repair fuse box of a semiconductor device according to the present invention has the following advantages.

It is possible to improve repair yield for defective portions of a semiconductor device by varying the layout of the etching stop layer without having to vary the basic prior art method for fabricating a repair fuse box for a semiconductor device.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications and variations will be apparent to those skilled in the art. In the claims, means-plus-function clauses are intended to cover the structures described herein as performing the recited function and not only structural equivalents but also equivalent structures.

What is claimed is:

1. A method for fabricating a repair fuse box for a semiconductor device comprising:

forming a first insulating film on a semiconductor substrate;

forming fuses on the first insulating film;

forming a second insulating film on the fuses and the first insulating film;

forming an etching stop polysilicon pattern layer on a portion of the second insulating film where the repair fuse box will be formed, wherein the etching stop polysilicon pattern is larger than the intended fuse box and positioned so as to overlap edge portions of the repair fuse box;

forming a third insulating film on the entire surface of the above structure;

forming a photoresist pattern on the third insulating film to expose a portion which will be used to form the repair fuse box, the photoresist pattern also exposing at least two overlapping portions of the etching stop polysilicon layer at the edge portions of the repair fuse box;

removing the third insulating film using the photoresist pattern as a mask to expose the etching stop polysilicon layer;

etching the exposed etching stop polysilicon layer to form an etching stop polysilicon layer pattern having two or more broken portions surrounding the edge portions of the repair fuse box; and etching a portion of the second insulating film exposed by the photoresist pattern to reduce the thickness of the second insulating film above the fuses.

2. The method of claim 1, wherein the fuses are formed from a Poly1 layer or a Poly2 layer, and the etching stop polysilicon layer is formed from a Poly4 layer.

* * * * *